US 8,405,005 B2

(12) United States Patent
Zucker et al.

(10) Patent No.: US 8,405,005 B2
(45) Date of Patent: Mar. 26, 2013

(54) ELECTROSTATIC CHUCK SYSTEM AND PROCESS FOR RADIALLY TUNING THE TEMPERATURE PROFILE ACROSS THE SURFACE OF A SUBSTRATE

(75) Inventors: Martin L. Zucker, Orinda, CA (US); Daniel J. Devine, Los Gatos, CA (US); Young Jai Lee, Sunnyvale, CA (US)

(73) Assignee: Mattson Technology, Inc., Fremont, CA (US)

( * ) Notice: Subject to any disclaimer, the term of this patent is extended or adjusted under 35 U.S.C. 154(b) by 413 days.

(21) Appl. No.: 12/696,119

(22) Filed: Jan. 29, 2010

(65) Prior Publication Data

US 2010/0193501 A1     Aug. 5, 2010

Related U.S. Application Data

(60) Provisional application No. 61/149,876, filed on Feb. 4, 2009.

(51) Int. Cl.
H05B 3/68 (2006.01)
(52) U.S. Cl. .................. 219/444.1; 219/468.1
(58) Field of Classification Search .................. 219/250, 219/251, 255, 420, 451.1, 465.1
See application file for complete search history.

(56) References Cited

U.S. PATENT DOCUMENTS

| | | |
|---|---|---|
| 4,645,218 A | 2/1987 | Ooshio et al. |
| 5,059,770 A | 10/1991 | Mahawili |
| 5,155,652 A | 10/1992 | Logan et al. |
| 5,280,156 A | 1/1994 | Niori et al. |
| 5,290,381 A | 3/1994 | Nozawa et al. |
| 5,294,778 A | 3/1994 | Carman et al. |
| 5,331,134 A | 7/1994 | Kimura |
| 5,539,179 A | 7/1996 | Nozawa et al. |
| 5,556,204 A | 9/1996 | Tamura et al. |
| 5,566,043 A | 10/1996 | Kawada et al. |
| 5,595,241 A | 1/1997 | Jelinek |
| 5,606,484 A | 2/1997 | Kawada et al. |
| 5,663,865 A | 9/1997 | Kawada et al. |
| 5,665,260 A | 9/1997 | Kawada et al. |
| 5,671,116 A | 9/1997 | Husain |
| 5,720,818 A | 2/1998 | Donde et al. |
| 5,730,803 A | 3/1998 | Steger et al. |
| 5,846,375 A | 12/1998 | Gilchrist et al. |
| 5,880,922 A | 3/1999 | Husain |

(Continued)

FOREIGN PATENT DOCUMENTS

| | | |
|---|---|---|
| EP | 0 498 752 A1 | 8/1992 |
| EP | 0 506 537 A1 | 9/1992 |

(Continued)

OTHER PUBLICATIONS

Search Report and Written Opinion for Application No. PCT/US2010/022465, dated Mar. 18, 2010.

*Primary Examiner* — Cheung Lee
(74) *Attorney, Agent, or Firm* — Dority & Manning, P.A.

(57) ABSTRACT

An electrostatic chuck system for maintaining a desired temperature profile across the surface of the substrate is disclosed. The electrostatic chuck system includes a pedestal support defining a substantially uniform temperature profile across the surface of the pedestal support and an electrostatic chuck supported by the pedestal support. The electrostatic chuck has a clamping electrode and a plurality of independently controlled heating electrodes. The independently controlled heating electrodes include an inner heating electrode defining an inner heating zone and a peripheral heating electrode defining a peripheral heating zone separated by a gap distance. The temperature profile across the surface of the substrate can be tuned by varying thermal characteristics of the pedestal thermal zone, the inner heating zone, the peripheral heating zone, or by varying the size of the gap distance between the inner heating electrode and the peripheral heating electrode.

19 Claims, 8 Drawing Sheets

U.S. PATENT DOCUMENTS

| | | | |
|---|---|---|---|
| 5,904,776 | A | 5/1999 | Donde et al. |
| 5,981,913 | A | 11/1999 | Kadomura et al. |
| 6,022,418 | A | 2/2000 | Iwabuchi |
| 6,080,970 | A | 6/2000 | Yoshida et al. |
| 6,108,189 | A | 8/2000 | Weldon et al. |
| 6,310,755 | B1 | 10/2001 | Kholodenko et al. |
| 6,365,879 | B1 | 4/2002 | Kuibira et al. |
| 6,414,834 | B1 | 7/2002 | Weldon et al. |
| 6,452,137 | B1 | 9/2002 | Kariya |
| 6,465,763 | B1 | 10/2002 | Ito et al. |
| 6,483,690 | B1 | 11/2002 | Nakajima et al. |
| 6,490,145 | B1 | 12/2002 | Kholodenko et al. |
| 6,490,146 | B2 | 12/2002 | Wang et al. |
| 6,508,884 | B2 | 1/2003 | Kuibira et al. |
| 6,535,372 | B2 | 3/2003 | Parkhe et al. |
| 6,538,872 | B1 | 3/2003 | Wang et al. |
| 6,566,632 | B1 | 5/2003 | Katata et al. |
| 6,581,275 | B2 | 6/2003 | Narendrnath et al. |
| 6,632,512 | B1 | 10/2003 | Ito |
| 6,664,738 | B2 | 12/2003 | Arai et al. |
| 6,677,557 | B2 | 1/2004 | Ito et al. |
| 6,710,307 | B2 | 3/2004 | Ito et al. |
| 6,717,116 | B1 | 4/2004 | Ito et al. |
| 6,721,162 | B2 | 4/2004 | Weldon et al. |
| 6,753,601 | B2 | 6/2004 | Hiramatsu et al. |
| 6,815,646 | B2 | 11/2004 | Ito et al. |
| 6,835,916 | B2 | 12/2004 | Ito et al. |
| 6,838,833 | B2 | 1/2005 | Arai et al. |
| 6,847,014 | B1 | 1/2005 | Benjamin et al. |
| 6,849,938 | B2 | 2/2005 | Ito |
| 6,861,165 | B2 | 3/2005 | Hiramatsu et al. |
| 6,861,620 | B2 | 3/2005 | Ito et al. |
| 6,878,906 | B2 | 4/2005 | Ito et al. |
| 6,878,907 | B2 | 4/2005 | Hiramatsu et al. |
| 6,887,316 | B2 | 5/2005 | Hiramatsu et al. |
| 6,888,106 | B2 | 5/2005 | Hiramatsu |
| 6,891,263 | B2 | 5/2005 | Hiramatsu et al. |
| 6,897,403 | B2 | 5/2005 | Udo et al. |
| 6,897,414 | B2 | 5/2005 | Ito et al. |
| 6,917,020 | B2 | 7/2005 | Ito |
| 6,919,124 | B2 | 7/2005 | Ito |
| 6,921,724 | B2 | 7/2005 | Kamp et al. |
| 6,924,464 | B2 | 8/2005 | Zhou et al. |
| 6,949,722 | B2 | 9/2005 | Strang et al. |
| 6,960,743 | B2 | 11/2005 | Hiramatsu et al. |
| 7,011,874 | B2 | 3/2006 | Ito et al. |
| 7,126,091 | B1 | 10/2006 | Westfall |
| 7,161,121 | B1 | 1/2007 | Steger |
| 7,230,204 | B2 | 6/2007 | Mitrovic et al. |
| 7,274,004 | B2 | 9/2007 | Benjamin et al. |
| 7,279,661 | B2 | 10/2007 | Okajima et al. |
| 7,297,894 | B1 | 11/2007 | Tsukamoto |
| RE40,052 | E | 2/2008 | Shirakawa et al. |
| 7,327,948 | B1 | 2/2008 | Shrinivasan et al. |
| 7,347,901 | B2 | 3/2008 | Fink et al. |
| 2002/0113056 | A1 | 8/2002 | Sugaya et al. |
| 2004/0178177 | A1 | 9/2004 | Kadotani et al. |
| 2004/0187787 | A1 | 9/2004 | Dawson et al. |
| 2005/0173404 | A1 | 8/2005 | Benjamin et al. |
| 2005/0211385 | A1 | 9/2005 | Benjamin et al. |
| 2006/0076108 | A1 | 4/2006 | Holland et al. |
| 2006/0076109 | A1 | 4/2006 | Holland et al. |
| 2006/0144516 | A1 | 7/2006 | Ricci et al. |
| 2006/0207725 | A1 | 9/2006 | Oohashi et al. |
| 2006/0221539 | A1 | 10/2006 | Morita et al. |
| 2006/0238954 | A1 | 10/2006 | Ishikawa et al. |
| 2007/0007276 | A1 | 1/2007 | Steger |
| 2007/0039942 | A1 | 2/2007 | Leung et al. |
| 2007/0139856 | A1 | 6/2007 | Holland et al. |
| 2007/0258186 | A1 | 11/2007 | Matyushkin et al. |
| 2008/0017104 | A1 | 1/2008 | Matyushkin et al. |
| 2008/0053958 | A1 | 3/2008 | Kadotani et al. |

FOREIGN PATENT DOCUMENTS

| | | |
|---|---|---|
| EP | 0 512 936 A | 11/1992 |
| GB | 1443215 | 7/1976 |
| WO | WO 97/44891 | 11/1997 |

ELECTROSTATIC CHUCK SYSTEM AND PROCESS FOR RADIALLY TUNING THE TEMPERATURE PROFILE ACROSS THE SURFACE OF A SUBSTRATE

PRIORITY CLAIM

This application claims the benefit of priority of U.S. Provisional Patent Application No. 61/149,876 filed on Feb. 4, 2009, which is incorporated by reference herein for all purposes.

BACKGROUND

Various different types of processing chambers are available for processing different types of workpieces and substrates. The substrates can comprise, for instance, glass plates, films, ribbons, solar panels, mirrors, liquid crystal displays, semiconductor wafers, and the like. Many different types of processing chambers are available, for instance, for processing semiconductor wafers during the manufacture of integrated circuit chips. The processing chambers can be used to anneal the wafers, carry out chemical vapor deposition, plasma enhanced chemical vapor deposition, etching processes, and other deposition processes.

The chamber typically includes a substrate holder, such as an electrostatic chuck assembly, to hold a substrate during processing. A typical electrostatic chuck includes one or more clamping electrodes covered by a dielectric layer. The clamping electrodes are used to generate an electrostatic clamping force for holding the substrate onto the top surface of the electrostatic chuck. Once a substrate is securely held onto a chuck, a process gas is introduced into a chamber and a plasma is formed to process the substrate. The substrate can be processed by a CVD, PVD, etch, implant, oxidation, nitridation or other process.

In many processes, it is desirable to control the temperature of the substrate during processing. Processes can be optimized, for instance, if the temperature of the substrate is uniform and is increased and decreased at desired rates and to desired maximums and minimums. In some embodiments, it can be desired to divide the substrate into a plurality of heating zones with each heating zone being maintained at different temperatures to compensate for different heating effects across the surface of the substrate during processing of the substrate. For instance, a substrate can include an inner heating zone and a peripheral heating zone with the peripheral heating zone being maintained at a higher temperature than the inner heating zone to compensate for additional heat loss occurring at the periphery of the substrate. In circumstances when adjacent heating zones are maintained at different temperatures, it can be preferable to have an abrupt or steep temperature gradient between adjacent heating zones to more adequately compensate for the varying heating effects during processing.

Thus, a need exists for an electrostatic chuck assembly that allows for the radial tuning or control of the temperature profile across the surface of the substrate and that provides an abrupt temperature gradient between adjacent heating zones.

SUMMARY

Aspects and advantages of the invention will be set forth in part in the following description, or may be obvious from the description, or may be learned through practice of the invention.

One exemplary embodiment of the present disclosure provides an system for maintaining a temperature profile across the surface of the substrate. The system includes a pedestal support having a pedestal thermal control system adapted to provide a pedestal thermal zone having thermal characteristics based on the output of the pedestal thermal control system. The pedestal thermal zone defines a substantially uniform temperature profile across the surface of the pedestal support. The electrostatic chuck assembly further includes an electrostatic chuck supported by the pedestal support. The electrostatic chuck has a clamping electrode and a plurality of heating electrodes. The heating electrodes include an inner heating electrode and a peripheral heating electrode separated by a gap distance. The inner heating electrode defines an inner heating zone having thermal characteristics based on the output of the inner heating electrode. The peripheral heating electrode defines a peripheral heating zone having thermal characteristics based on the output of the peripheral heating electrode. The electrostatic chuck assembly includes a control system for adjusting the temperature profile across the surface of the substrate by varying at least one of the output of the pedestal thermal control system, the inner heating electrode, or the peripheral heating electrode.

In a variation of this particular embodiment, the control system can be adapted to adjust the temperature gradient between the inner heating zone and the peripheral heating zone by varying the output of at least one of the pedestal thermal control system, inner heating electrode, or peripheral heating electrode.

In other variations of this exemplary embodiment, the clamping electrode can be a monopolar electrode or a bipolar electrode. The electrostatic chuck assembly can also be comprised primarily of a ceramic material having a low thermal conductivity such as aluminum oxide. The top surface of the electrostatic chuck can include a raised peripheral seal ring and a plurality of mesas having a height approximately equal to the height of the raised peripheral seal ring.

In yet another variation of this exemplary embodiment, the pedestal thermal control system can include a fluid flow channel for circulating a thermal exchange fluid. For instance, the thermal control system can include an inner fluid flow channel and a peripheral fluid flow channel being controlled to provide a substantially uniform temperature profile across the surface of the pedestal support. Thermal characteristics of the pedestal thermal zone can be varied by adjusting the output of the pedestal thermal control system, for instance, by regulating the temperature or flow of the fluid through the fluid flow channels.

In still another variation of this exemplary embodiment, the electrostatic chuck includes an additional heating electrode between the inner heating electrode and peripheral heating electrode. The gap distance between the inner heating electrode and the peripheral heating electrode can be adjusted by energizing the additional heating electrode. The control system can be adapted to adjust the temperature gradient between the inner heating zone and peripheral heating zone by adjusting the size of the gap distance.

Another exemplary embodiment of the present disclosure provides a system for maintaining a temperature profile across the surface of a substrate during processing. The system includes a pedestal defining a substantially uniform temperature profile across the surface of the pedestal and an electrostatic chuck having a clamping electrode and a plurality of heating electrodes. The heating electrodes include an inner heating electrode defining an inner heating zone and a peripheral heating electrode defining a peripheral heating zone. The inner heating electrode and the peripheral heating electrode are separated by a gap distance sufficient to create a temperature gradient between the peripheral heating zone and the inner heating zone. The temperature gradient is at least 6° C./cm when the temperature of the peripheral heating zone is maintained approximately 28.5° C. higher than the temperature of the inner heating zone. For instance, the temperature gradient can be at least 10° C./cm. In variations of this exemplary embodiment, the gap distance can be approximately 15 mm to 35 mm, such as approximately 18 mm to 30 mm, such as approximately 20 mm, or any other gap distance or range of gap distances therebetween.

A further exemplary embodiment of the present disclosure provides a process for adjusting the temperature profile across the surface of a substrate. The process includes placing a substrate on an electrostatic chuck assembly that includes an electrostatic chuck supported by a pedestal. The electrostatic chuck includes a clamping electrode and an inner heating electrode defining an inner heating zone and a peripheral heating electrode defining a peripheral heating zone. The inner heating electrode and the peripheral heating electrode are separated by a gap distance. The process further includes clamping the substrate on the electrostatic chuck assembly by energizing the clamping electrode and tuning the temperature gradient between the inner heating zone and peripheral heating zone by varying the size of the gap distance between the inner heating electrode and the peripheral heating electrode.

In a variation of this exemplary embodiment, the size of the gap distance between the inner heating electrode and the peripheral heating electrode can be varied by energizing an additional heating electrode disposed between the inner heating electrode and the outer heating electrode. In other variations of this exemplary embodiment, the temperature gradient between the inner heating zone and the peripheral heating zone can be adjusted by adjusting the power supplied to the inner heating electrode or the peripheral heating electrode, or by regulating the flow and temperature of heat transfer fluid through the pedestal.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment, can be used with another embodiment to yield a still further embodiment. Thus, it is intended that the present invention covers such modifications and variations as come within the scope of the appended claims and their equivalents.

Generally, the present disclosure is directed to an electrostatic chuck system and process for supporting a substrate and for maintaining a desired temperature profile across the surface of the substrate during processing. An example temperature profile is graphically represented in FIG. 8 as a function of distance from the peripheral edge of the substrate. A temperature profile can also be graphically depicted as a function of distance from the center of the substrate.

The electrostatic chuck assembly of this exemplary embodiment can include a pedestal support having a pedestal thermal control system adapted to provide a pedestal thermal zone. The pedestal thermal zone defines a substantially uniform temperature profile across the surface of the pedestal support. The pedestal thermal zone has thermal characteristics based on the output of the pedestal thermal control system.

The electrostatic chuck assembly can further include an electrostatic chuck supported by the pedestal support. The electrostatic chuck can have a clamping electrode and a plurality of independently controlled heating electrodes. The independently controlled heating electrodes include an inner heating electrode and a peripheral heating electrode. The inner heating electrode defines an inner heating zone having thermal characteristics based on the output of the inner heating electrode. The peripheral heating electrode defines a peripheral heating zone having thermal characteristics based on the output of the peripheral heating electrode.

The inner heating electrode and the peripheral heating electrode can be separated by a gap distance. As used herein, the term gap distance refers to a space or gap between energized heating electrodes that has a distance. The gap distance preferably comprises a dielectric material of low thermal conductivity such as aluminum oxide. The gap distance can also comprise additional heating electrodes that have not been energized such as in the embodiment of the electrostatic chuck assembly having a moveable interface between heating electrodes. The size of the gap distance refers to the distance of separation between the energized heating electrodes.

In certain embodiments, the electrostatic chuck assembly includes a control system adapted to radially tune or adjust the temperature profile across the surface of the substrate by varying the output of the pedestal thermal control system, the inner heating electrode, or the peripheral heating electrode. The control system can also be adapted to radially tune or adjust the temperature profile across the surface of the substrate by varying the size of the gap distance between the heating electrodes. The control system can include a single controller or multiple controllers for varying the output of the pedestal thermal control system, the inner heating electrode, or the peripheral heating electrode.

The various heating zones of the electrostatic chuck can be maintained at different temperatures. For instance, the temperature of the peripheral heating zone can be maintained at a higher temperature than the temperature of the inner heating zone. In these circumstances, a temperature gradient exists between the inner heating zone and the peripheral heating zone. The temperature gradient refers to the amount the temperature of a substrate differs over a unit of length of the substrate. For instance, a temperature gradient of 6° C./cm indicates that the temperature varies by 6° C. over 1 cm length.

The electrostatic chuck assembly according to embodiments of the present disclosure allows a user to adjust the temperature gradient between two heating zones by varying the thermal characteristics of at least one of the pedestal thermal zone, inner heating zone and/or peripheral heating zone or by adjusting the size of the gap distance between the inner heating zone and the peripheral heating zone. In this manner, the electrostatic chuck assembly according to embodiments of the present disclosure enhances the ability to obtain an desired temperature gradient on a substrate during processing.

Figure 1:
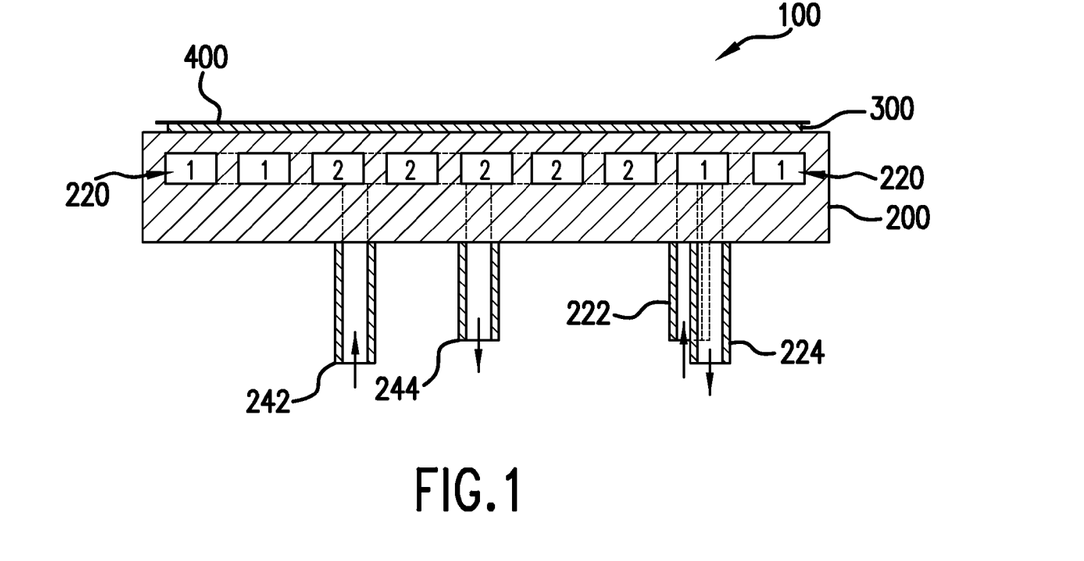
FIG. 1 depicts a side view of an electrostatic chuck assembly according to an exemplary embodiment of the present disclosure.

Referring now to FIG. 1, an exemplary electrostatic chuck assembly 100 includes metal pedestal support 200 and electrostatic chuck 300. Pedestal support 200 has a top surface for supporting electrostatic chuck 300. The top surface or clamping surface 310 of electrostatic chuck 300 supports substrate 400 during processing. Substrate 400 can be a semiconductor wafer subjected to a plasma etch process, thermal process, or other process.

The electrostatic chuck 300 can be attached to the pedestal support 200 using an elastomeric adhesive. This adhesive should be thin to minimize stress generated from differential thermal expansion between the pedestal support 200 and the electrostatic chuck 300. The adhesive should also ensure good thermal contact between the electrostatic chuck 300 and the pedestal support 200. For instance, the adhesive layer can have a thermal conductivity of approximately 1.1 W/mK and a thickness of approximately 0.28 mm.

The pedestal support 200 can be made from a metal (e.g. aluminum) and includes a thermal control system for maintaining a substantially uniform temperature profile across the entire top surface of the pedestal support 200. The thermal control system provides a pedestal thermal zone having thermal characteristics based on the output of the thermal control system. For instance, the thermal characteristics of the pedestal thermal zone can be varied by regulating the flow of a thermal exchange fluid through the pedestal or by regulating the temperature of a thermal exchange fluid flowing through the pedestal.

Figure 2:
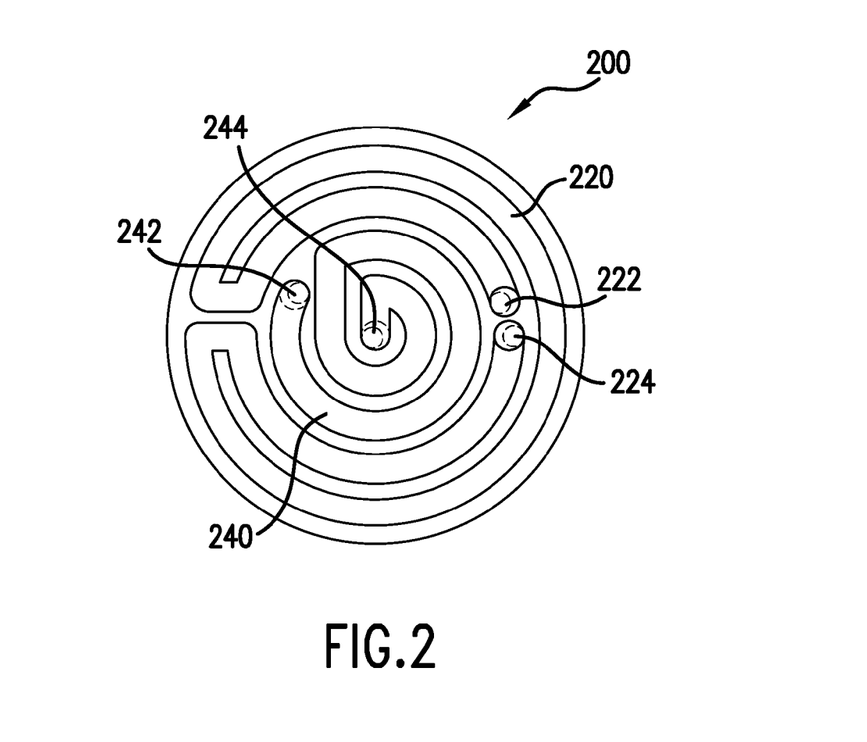
FIG. 2 depicts a plan view of an exemplary pedestal support according to an exemplary embodiment of the present disclosure.

In FIGS. 1 and 2, the thermal control system includes two separate channels 220, 240 for circulating a thermal exchange fluid through the pedestal. The two separate channels 220, 240 are operated at the same temperature to provide a uniform pedestal thermal zone. A variety of temperature control devices can be used to maintain the temperature of the channels 220, 240 at the same temperature. For instance, the two channels 220, 240 can be connected to either a single or dual heat exchange recirculation system that will control both channels to the same temperature.

The use of two channels 220, 240 is preferred because, in certain embodiments, a single channel cannot extract enough heat. For instance, a single channel can be too long, causing the thermal properties of the liquid traveling through the single channel to change substantially before the liquid exits the channel. In addition, two channels maintained at a flow of, for example 3 GPM, are easier to implement than one channel maintained at a flow of, for instance 6 GPM (i.e. smaller lines & connections). The pedestal support 200 has two inputs 222, 242 and two outputs 224, 244 for circulating two streams of a thermal control liquid through the two separate channels 220, 240 contained inside the pedestal body. The thermal control liquid can be a water glycol mixture or other suitable thermal exchange liquid.

Figure 3:
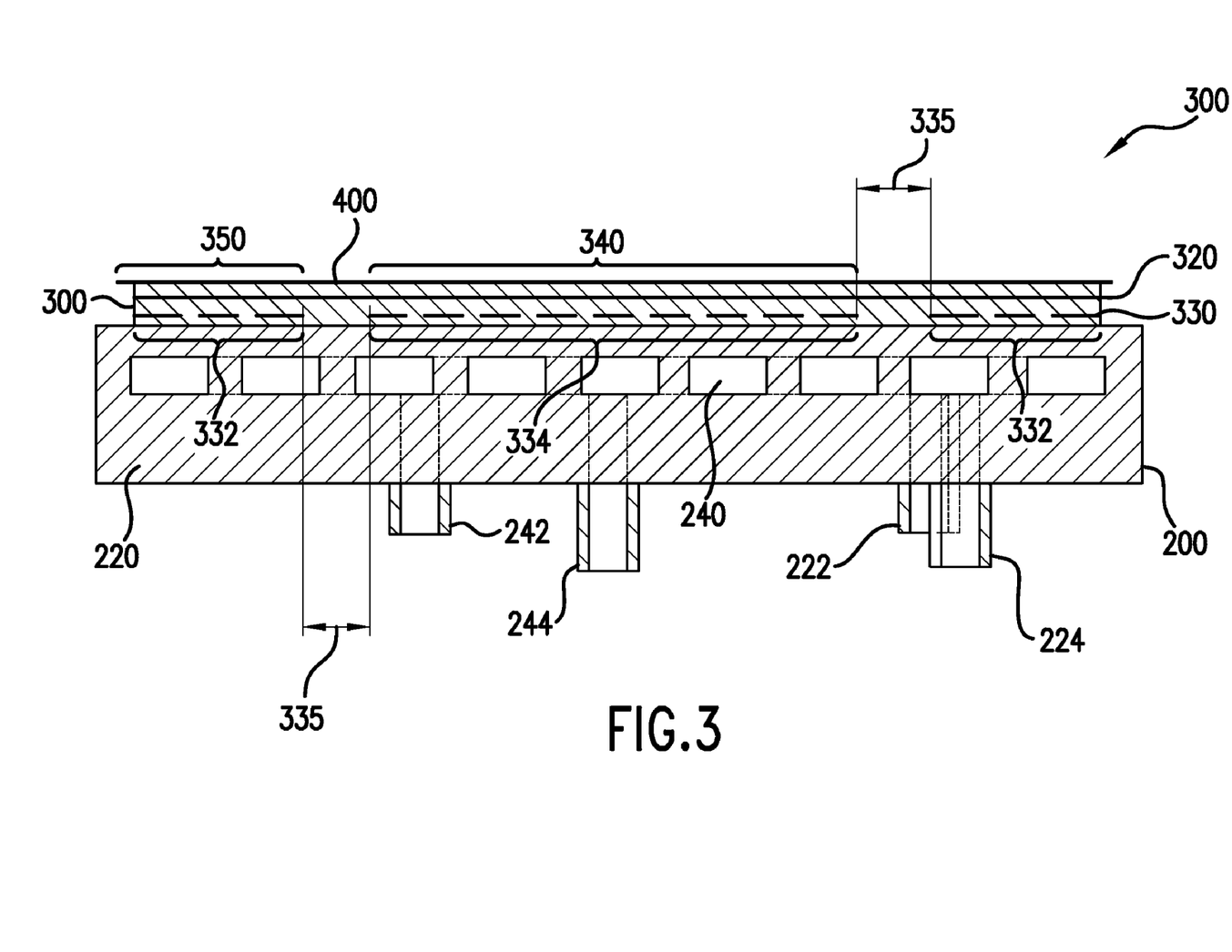
FIG. 3 depicts a side view of an electrostatic chuck assembly according to an exemplary embodiment of the present disclosure.

As shown in FIG. 3, electrostatic chuck 300 includes clamping electrodes 320 and a plurality of independently controlled heating electrodes 330. The clamping electrodes 320 are used to generate an electrostatic clamping force for clamping a substrate 400 to the clamping surface 310 of the electrostatic chuck 300. The heating electrodes 330 are used to define a plurality of heating zones. Thermal characteristics of the heating zones are adjusted by controlling the output if the independently controlled heating electrodes 330.

The electrostatic chuck 300 can be formed from a variety of materials, including a ceramic material. Preferably, the electrostatic chuck material has a low thermal conductivity to maintain steep temperature gradients between adjacent thermal zones. For instance, the electrostatic chuck can be formed from a ceramic material having a composition of approximately 94% $Al_2O_3$ and 6% $SiO_2$.

Figure 5:
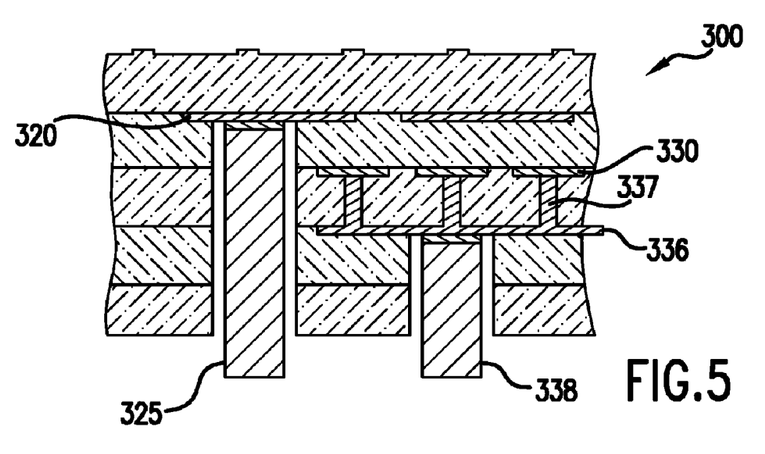
FIG. 5 depicts a layered electrostatic chuck according to an exemplary embodiment of the present disclosure.

The electrostatic chuck 300 can be formed from multiple layers of green or partially fired ceramic with three or four layers of thin-film metal electrodes disposed between layers of ceramic. For instance, FIG. 5 depicts a multilayered ceramic electrostatic chuck 300. The electrostatic chuck 300 includes clamping electrode 320 disposed between two ceramic layers and heating electrodes 330 disposed between two different ceramic layers. All layers of ceramic and electrodes will undergo a final firing to form a finished electrostatic chuck 300.

Figure 4:
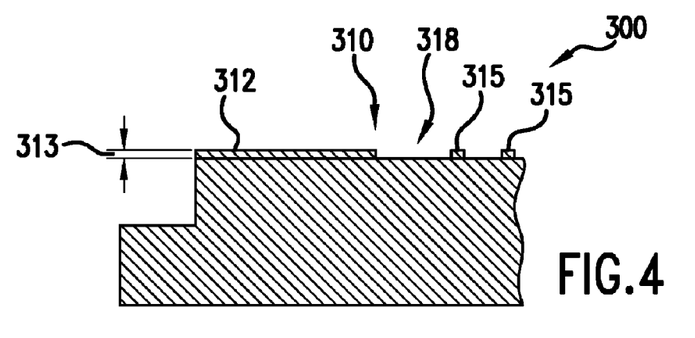
FIG. 4 depicts an electrostatic chuck clamping surface according to an exemplary embodiment of the present disclosure.

As shown in FIG. 4, final fabrication of the electrostatic chuck 300 can involve forming a raised clamping surface 310 that comprises a raised peripheral ring 312 that will form an approximate seal with the bottom surface of a substrate 400 clamped to the clamping surface 310 of the electrostatic chuck 300. The raised peripheral ring 312 can have a height 313 of, for instance, 5 μm. The remaining clamping surface 310 of the electrostatic chuck can contain a multitude of mesas 315 having a height equal to that of the peripheral ring 312. The grooves 318 allow for the flow of a heat transfer gas, for instance helium or other heat transfer gas, between the clamping surface 310 of the electrostatic chuck 300 and a substrate 400 mounted to the electrostatic chuck 300.

The electrostatic chuck 300 can be a Johnsen-Rahbek electrostatic chuck or a Coulombic type electrostatic chuck 300. A Johnsen-Rahbek electrostatic chuck creates an electrostatic clamping force between the clamping surface 310 of the electrostatic chuck 300 and a substrate 400. A Coulombic type electrostatic chuck creates an electrostatic clamping force between the clamping electrodes 320 and a substrate 400.

Figure 6:
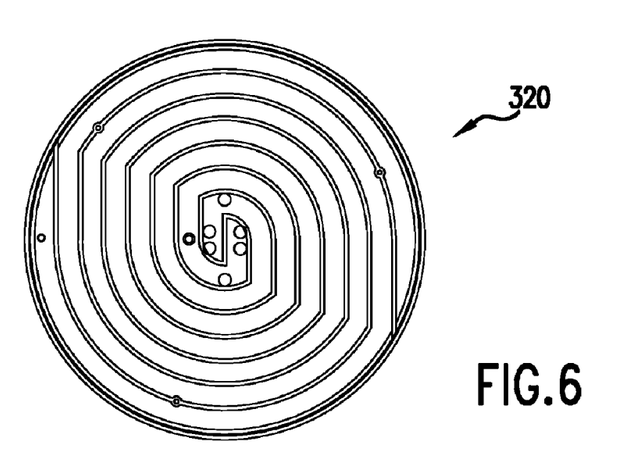
FIG. 6 depicts a plan view of an exemplary pattern of clamping electrodes according to an exemplary of the present disclosure.

The clamping electrodes 320 can be fabricated of metal such as tungsten or other metal having a suitable coefficient of thermal expansion and electrical resistance properties and can be formed on the surface of a single layer of ceramic or on adjacent ceramic layers. The clamping electrodes 320 can be formed using a deposition process such as screen printing, PVD, CVD, ALD, or plasma or arc spray. As shown in FIG. 5, the electrostatic chuck 300 includes a single post connection 325 for connecting the clamping electrodes to a power source. An exemplary pattern of clamping electrodes 320 is depicted in FIG. 6.

The electrostatic chuck 300 can be operated in either a bipolar or a monopolar configuration. For instance, in the case of a monopolar configuration, a single disc-shaped clamping electrode 320 is located between two ceramic layers. In the case of a bipolar configuration, two or more clamping electrodes 320 are located between two ceramic layers. If the two clamping electrodes are connected to voltage sources having opposite polarities, the electrostatic chuck 300 can be operated as a bipolar electrostatic chuck. If the two electrodes are connected to a common voltage source, the electrostatic chuck 300 operates can be operated as a monopolar device.

Figure 7:
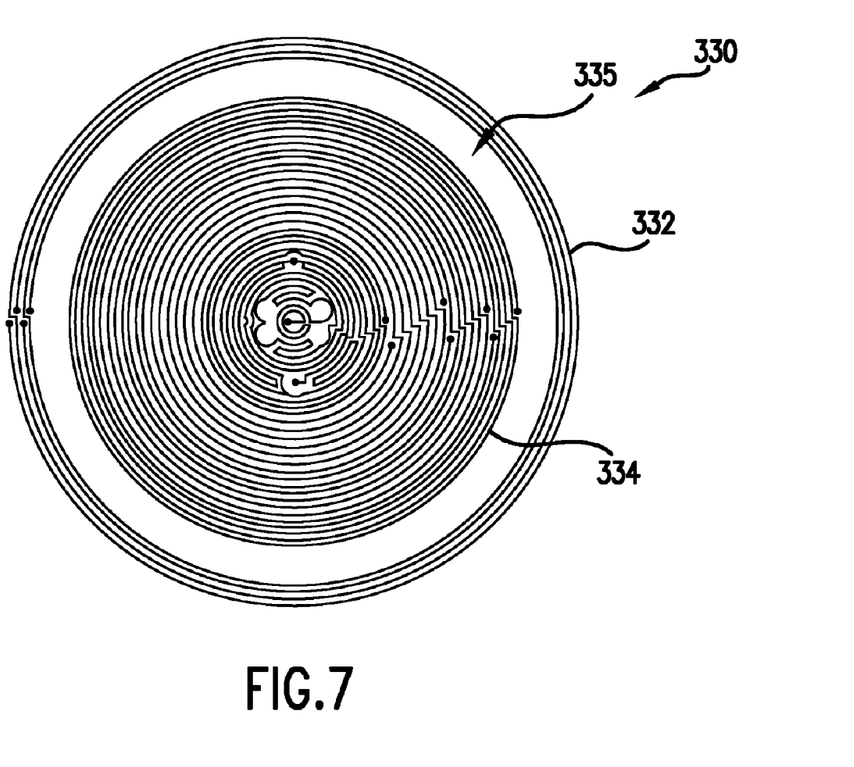
FIG. 7 depicts a plan view of an exemplary pattern of heating electrodes according to an exemplary of the present disclosure.

The electrostatic chuck 300 shown in FIG. 3 includes a plurality of independently controlled thin-film resistive heating electrodes 330 embedded within electrostatic chuck 300. The heating electrodes 330 can be fabricated of metal such as tungsten or other suitable metal and formed using a conventional deposition process such as screen printing, PVD, CVD, ALD, or plasma or arc spraying. Each heating electrode 330 defines a heating zone having thermal characteristics based on the output of the heating electrodes 330. For instance, the plurality of independently controlled heating electrodes 330 includes an inner heating electrode 334 defining an inner heating zone and a peripheral heating electrode 332 defining a peripheral heating zone. The inner heating electrode 334 defines a disc shaped heating zone located in the center of the electrostatic chuck 300. The peripheral heating electrode 332 defines a ring shaped heating zone surrounding the inner heating zone. The inner heating zone and the peripheral heating zone are separated by a gap distance 335. FIG. 7 depicts an exemplary pattern of heating electrodes 330 according to one embodiment of the present disclosure.

The thermal characteristics of the inner heating zone and the peripheral heating zone can be adjusted by varying the output of the inner heating electrode and peripheral heating electrode respectively. For instance, the thermal characteristics of the inner heating zone can be varied by adjusting the amount of power supplied to the inner heating electrode 334. Similarly, the thermal characteristics of the peripheral heating zone can be varied by adjusting the amount of power supplied to the peripheral heating electrode 332. The capability of adjusting the thermal characteristics of the inner and peripheral heating zones allows radial tuning of the temperature profile across the surface of the substrate. As shown in FIG. 5, a heating electrode 330 can be connected to a power source through vias 337, heating bus 336 and single post connection 338.

The temperature profile of the substrate can be measured using a variety of temperature measuring techniques. For instance, the temperature profile of the substrate can approximated by measuring the temperature profile of the electrostatic chuck at a location close to the top surface of the electrostatic chuck. Throughout the present disclosure, reference to the temperature of a heating zone refers to the temperature of the electrostatic chuck at a location in the heating zone close to the top surface of the electrostatic chuck.

In one exemplary embodiment, a fiber-optic temperature sensor can be used to monitor temperature. In this embodiment, a small disc containing a phosphor emits light having a predictable decay rate proportional to temperature. The phosphor coated disc is located near the clamping surface 310 of the electrostatic chuck 300 so that the measurement serves as a good predictor of the temperature of the substrate 400 clamped to the clamping surface 310 of the electrostatic chuck 300. A fiber-optic is located at a fixed distance from the phosphor coated disc to reliably capture light emitted by the phosphor.

Figure 8:
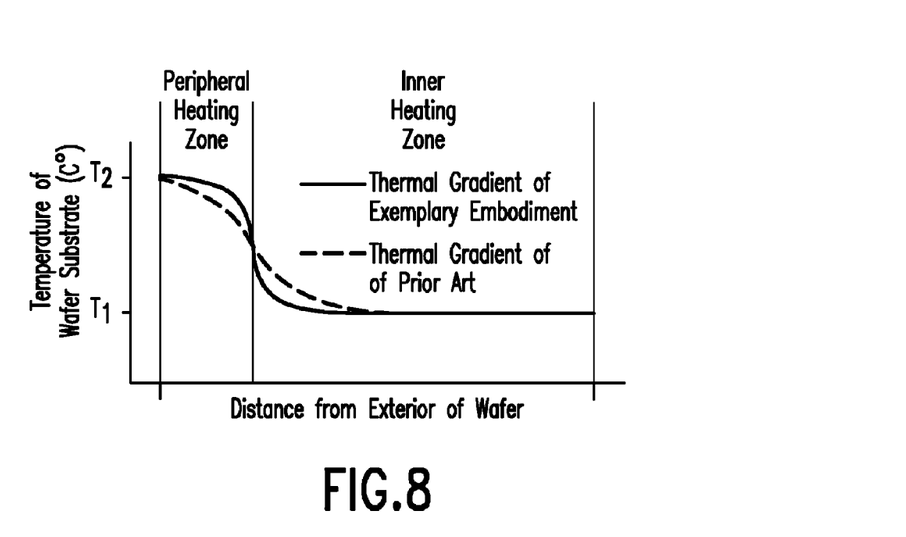
FIG. 8 depicts a graphical representation of a temperature profile across the surface of a substrate according to an exemplary embodiment of the present disclosure.

FIG. 8 depicts a graphical representation of an exemplary desired temperature profile across the surface of a substrate. As illustrated, the peripheral edge of the substrate corresponding to the peripheral heating zone has been tuned to achieve a higher temperature ($T_2$) than the temperature ($T_1$) of the central portion of the substrate corresponding to the inner heating zone. An abrupt temperature gradient exists between the inner heating zone and the peripheral heating zone.

The electrostatic chuck assembly of the present disclosure can be used to tune the temperature gradient between the inner heating zone and the peripheral heating zone so that temperature gradient is steeper than gradients achieved by substrate holders known in the prior art. For instance, the temperature gradient between the inner heating zone and peripheral heating zone can be tuned by varying the output of the pedestal thermal control system, the inner heating electrode, or the peripheral heating electrode. The applicants have also discovered that the temperature gradient can be tuned by varying the size of the gap distance between the inner heating electrode and the peripheral heating electrode.

Figure 9:
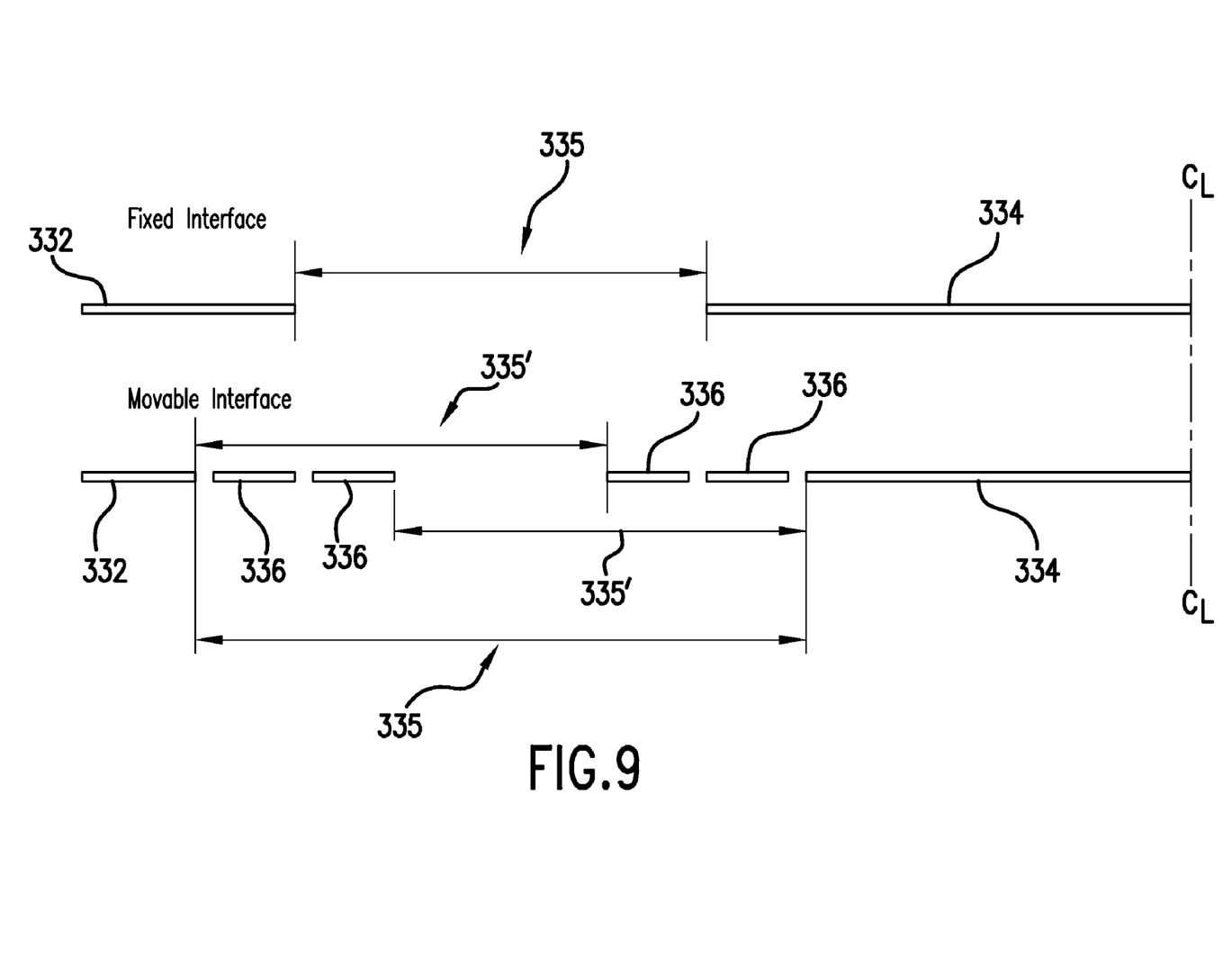
FIG. 9 depicts a heating electrode configuration providing a movable interface between the inner heating electrode and outer heating electrode according to an exemplary embodiment of the present disclosure.

A movable interface for varying the size of the gap distance between the inner heating electrode and peripheral heating electrode is disclosed in FIG. 9. The movable interface includes additional heating electrodes 336 disposed between the inner heating electrode 334 and the peripheral heating electrode 332. When none of the additional heating electrodes 336 are energized, the size of the gap distance 335 equals the distance between the inner heating electrode 334 and peripheral heating electrode 332. However, if an additional heating electrode 336 is energized, the gap distance adjusts from gap distance 335 to gap distance 335'. The size of gap distance 335' is the distance between the additional heating electrode and the peripheral or inner heating electrode and is smaller than the size of original gap distance 335. Using this movable interface, the temperature gradient between the inner heating zone and the peripheral heating zone can be tuned by adjusting the size of the gap distance between the inner heating electrode and the peripheral heating electrode. In this manner, an abrupt or steep temperature gradient between the inner heating zone and peripheral heating zone can be maintained.

Figure 10:
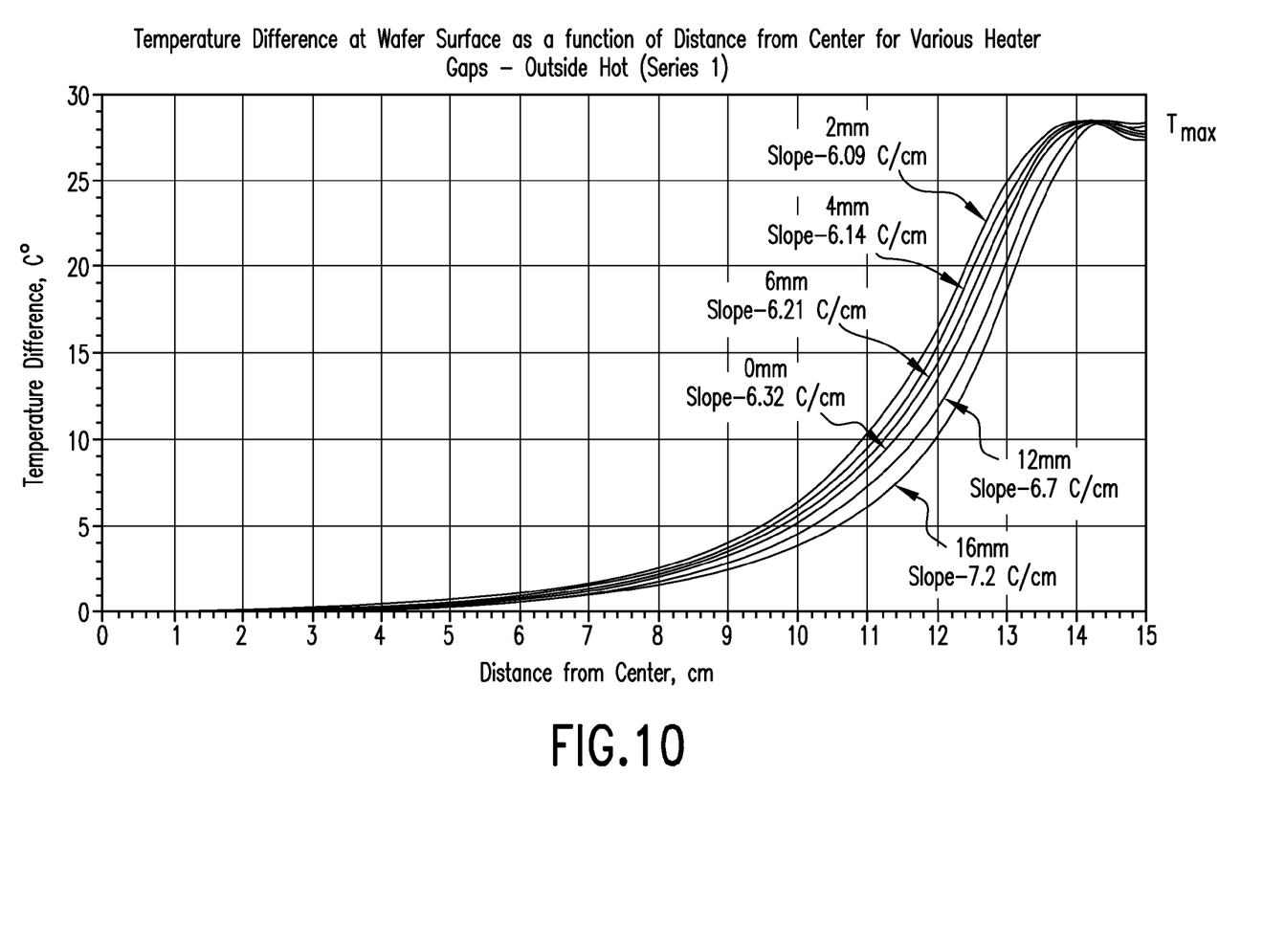
FIG. 10 depicts a graphical representation of the temperature difference of a substrate plotted as a function of distance from the center of the substrate for various gap distances.
Figure 11:
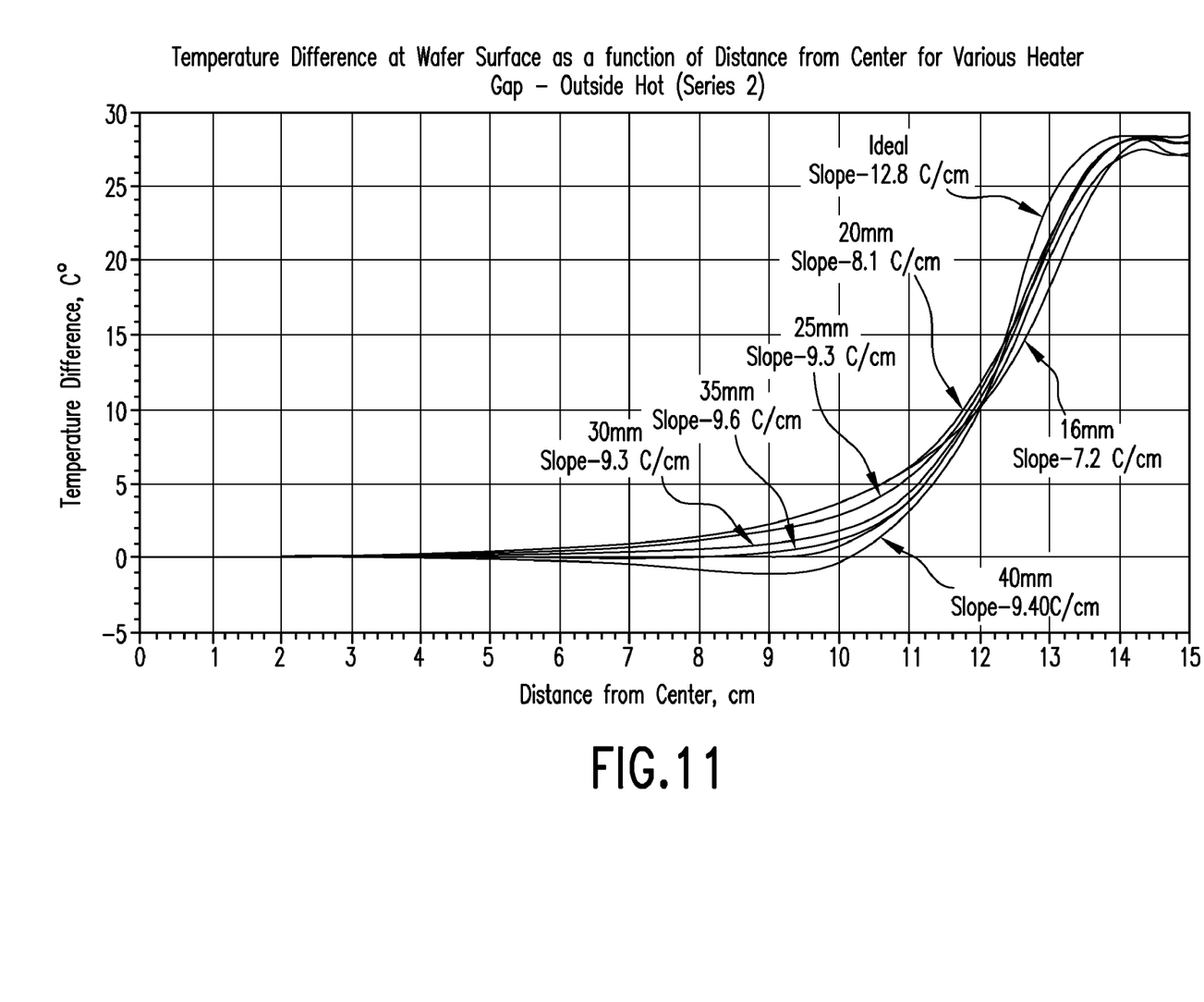
FIG. 11 depicts another graphical representation of the temperature difference of a substrate plotted as a function of distance from the center of the substrate for varying gap distances.

For example, FIGS. 10 and 11 provide simulation results demonstrating the effect of changing the size of the gap distance between the inner heating zone and the peripheral heating zone on the temperature gradient between the inner heating zone and the peripheral heating zone. In performing the simulations, the peripheral heating zone was maintained at a temperature approximately 28.5° C. higher than the temperature of the inner heating zone. FIGS. 10 and 11 provide graphical representations of the temperature differences plotted as a function of distance from the center of the electrostatic chuck for electrostatic chuck assemblies having varying gap distances between the inner heating electrode and the peripheral heating electrode. As illustrated, the abruptness or steepness of the temperature gradient is dependent on the size of the gap distance between the inner heating electrode and peripheral heating electrode. More particularly, the temperature gradient varied from approximately 6° C./cm at a 2 mm gap to approximately 10° C./cm at a 35 mm gap.

In these examples, the temperature gradient was measured by calculating the slope of the temperature difference curve plotted as a function of distance from the center of the substrate. The slope is equal to the change in temperature difference divided by the change in distance for the middle 50% of the temperature difference curve according to the following formula:

$$\text{Slope} = \frac{T_2 - T_1}{d_2 - d_1}$$

where $T_2 = 0.75 T_{max}$; $T_1 = 0.25 T_{max}$; $d_2$=the distance from center at $T_2$; $d_1$=the distance from center at $T_1$; and $T_{max}$ is equal to the maximum temperature difference. The results depicted in FIGS. 10 and 11 indicate that the temperature gradient between the inner heating zone and peripheral heating zone is tunable based at least in part on the size of the gap distance between inner heating electrode and peripheral heating electrode.

Figure 12:
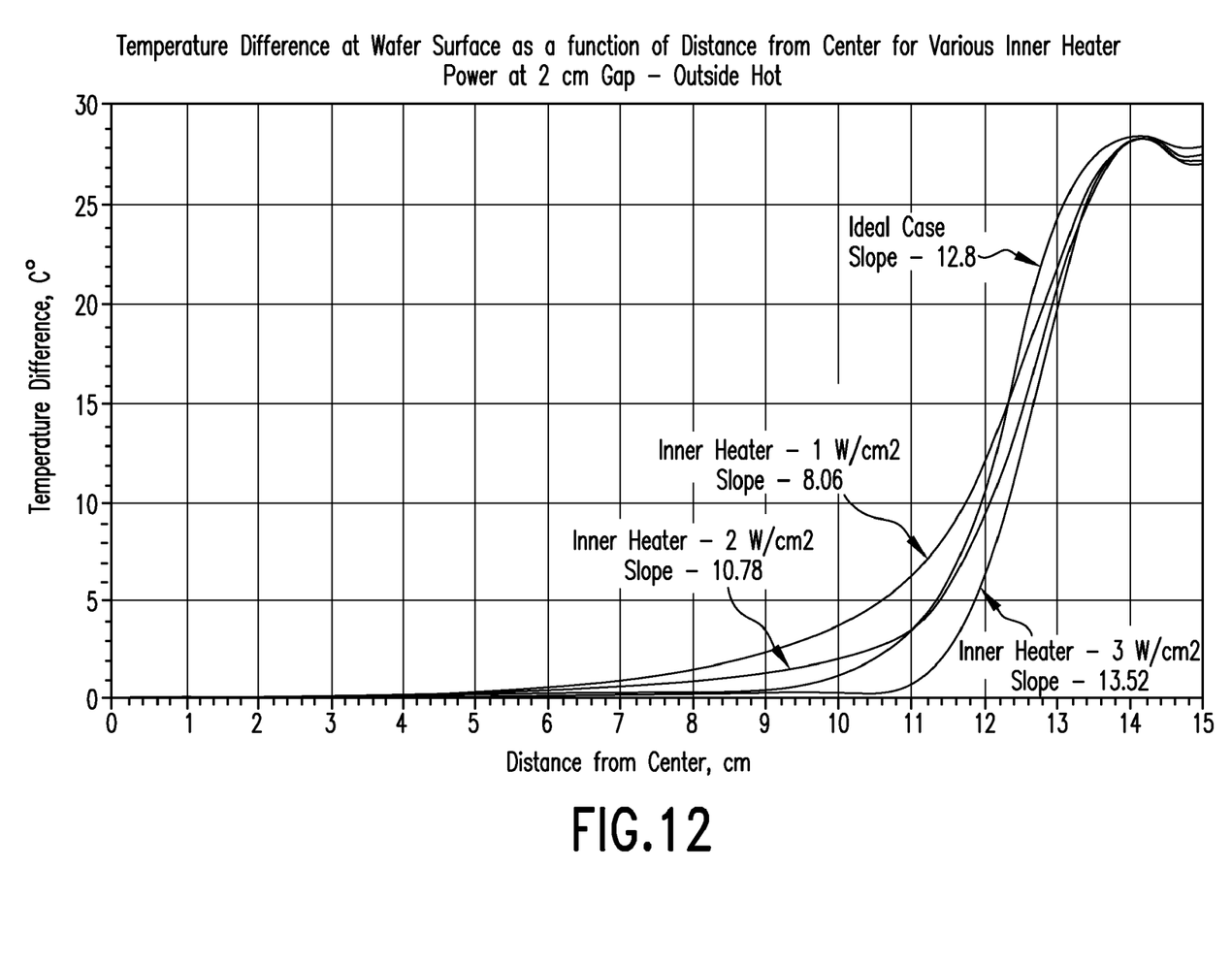
FIG. 12 depicts a graphical representation of the temperature difference of a substrate plotted as a function of distance from the center of the substrate for varying amounts of power applied to the inner electrode.

The temperature gradient can also be tuned by varying the power supplied to the inner or peripheral heating electrodes. FIG. 12 provides a graphical representation of the temperature difference at the substrate surface as a function of distance from the center of the substrate for electrostatic chuck assemblies having a gap distance of 20 mm at varying amounts of energy applied to the inner heating electrode. FIG. 12 illustrates that by holding the gap fixed between adjacent electrodes and only changing the energy supplied to the inner electrode, the temperature gradient increases from approximately 8° C./cm at 1 W/cm² to approximately 13.5° C./cm at 3 W/cm².

While the present subject matter has been described in detail with respect to specific exemplary embodiments and methods thereof, it will be appreciated that those skilled in the art, upon attaining an understanding of the foregoing can readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A system for adjusting a temperature profile across the surface of a substrate, comprising:
    a pedestal support comprising a pedestal thermal control system adapted to provide a pedestal thermal zone, the pedestal thermal zone defining a substantially uniform temperature profile across the surface of the pedestal support, the pedestal thermal zone having thermal characteristics based on the output of the pedestal thermal control system;
    an electrostatic chuck supported by the pedestal support, the electrostatic chuck comprising a clamping electrode and a plurality of heating electrodes, the heating electrodes comprising an inner heating electrode and a peripheral heating electrode separated by a gap distance, the size of the gap distance being the distance of separation between energized heating electrodes, the inner heating electrode defining an inner heating zone having thermal characteristics based on the output of the inner heating electrode, the peripheral heating electrode defining a peripheral heating zone having thermal characteristics based on the output of the peripheral heating electrode; and
    a control system adapted to adjust the temperature profile across the surface of the substrate by varying at least one of the output of the pedestal thermal control system, inner heating electrode, or peripheral heating electrode.

2. The system of claim 1, wherein the control system is adapted to adjust the temperature gradient between the inner heating zone and the peripheral heating zone by varying at least one of the output of the pedestal thermal control system, inner heating electrode, or peripheral heating electrode.

3. The system of claim 1, wherein the clamping electrode is a monopolar electrode.

4. The system of claim 1, wherein the clamping electrode is a bipolar electrode.

5. The system of claim 1, wherein the electrostatic chuck comprises aluminum oxide.

6. The system of claim 1, wherein the pedestal thermal control system comprises a fluid flow channel for circulating a thermal exchange fluid.

7. The system of claim 6, wherein the pedestal thermal control system comprises an inner fluid flow channel and a peripheral fluid flow channel, the inner fluid flow channel and peripheral fluid flow channel being controlled to provide a substantially uniform temperature profile across the surface of the pedestal support.

8. The system of claim 1, wherein the top surface of the electrostatic chuck comprises a raised peripheral seal ring and a plurality of mesas having a height approximately equal to the height of the raised peripheral seal ring.

9. The system of claim 1, wherein the electrostatic chuck comprises at least one additional heating electrode between the inner heating electrode and the peripheral heating electrode, the controller control system being adapted to adjust the size of the gap distance between the inner heating electrode and the peripheral heating electrode by energizing the at least one additional heating electrode.

10. The system of claim 9, wherein the control system is adapted to adjust the temperature gradient between the inner heating zone and the peripheral heating zone by varying the size of the gap distance between the inner heating electrode and the peripheral heating electrode.

11. The system of claim 1, wherein the gap distance has a size sufficient to create a temperature gradient between the peripheral heating zone and the inner heating zone, the temperature gradient having a value of at least approximately 6° C./cm when the temperature of the peripheral heating zone is maintained approximately 28.5° C. higher than the temperature of the inner heating zone.

12. A system for maintaining a temperature profile across the surface of a substrate during processing, the system comprising:
    a pedestal defining a substantially uniform temperature profile across the surface of the pedestal;
    an electrostatic chuck comprising a clamping electrode and a plurality of heating electrodes, the heating electrodes comprising an inner heating electrode defining an inner heating zone and an adjacent peripheral heating electrode defining a peripheral heating zone;

wherein the inner heating electrode and the peripheral heating electrode are separated by a gap distance having a size sufficient to create a temperature gradient between the peripheral heating zone and the inner heating zone, the size of the gap distance being the distance between the inner heating electrode and the peripheral heating electrode, the temperature gradient being at least 6° C./cm when the temperature of the peripheral heating zone is maintained approximately 28.5° C. higher than the temperature of the inner heating zone.

13. The system of claim 12, wherein the gap distance has a size sufficient to cause the temperature gradient between the inner heating zone and peripheral heating zone to be at least approximately 8° C./cm when the temperature of the peripheral heating zone is maintained approximately 28.5° C. higher than the temperature of the inner heating zone.

14. The system of claim 12, wherein the size of the gap distance is from approximately 15 mm to approximately 35 mm.

15. The system of claim 12, wherein the size of the gap distance is approximately 20 mm.

16. A process for radially tuning the temperature profile across the surface of a substrate, the process comprising:

placing a substrate on an electrostatic chuck assembly comprising an electrostatic chuck supported by a pedestal, the electrostatic chuck comprising a clamping electrode and an inner heating electrode defining an inner heating zone and a peripheral heating electrode defining a peripheral heating zone, the inner heating electrode and the peripheral heating electrode being separated by a gap distance;

clamping the substrate on the electrostatic chuck assembly by energizing the clamping electrode;

adjusting the temperature gradient between the inner heating zone and the peripheral heating zone by adjusting the size of the gap distance between the inner heating electrode and the peripheral heating electrode, the size of the gap distance being the distance of separation between the energized heating electrodes;

wherein the size of the gap distance is adjusted by selectively energizing an additional heating electrode located between the inner heating electrode and the peripheral heating electrode.

17. The process of claim 16, wherein the process further comprises adjusting the temperature gradient between the inner heating zone and the peripheral heating zone by varying the power supplied to the inner heating electrode or the peripheral heating electrode.

18. The process of claim 17, wherein the process further comprises circulating a heat transfer fluid through the pedestal.

19. The process of claim 17, wherein the process further comprises adjusting the temperature gradient between the inner heating zone and the peripheral heating zone by regulating the heat transfer fluid flowing through the pedestal.

* * * * *